(12) United States Patent
Zhang et al.

(10) Patent No.: US 11,805,664 B2
(45) Date of Patent: Oct. 31, 2023

(54) ELECTRONIC DISPLAY DEVICE

(71) Applicant: BOE TECHNOLOGY GROUP CO., LTD., Beijing (CN)

(72) Inventors: Bin Zhang, Beijing (CN); Xinxing Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 754 days.

(21) Appl. No.: 16/473,121

(22) PCT Filed: Dec. 21, 2018

(86) PCT No.: PCT/CN2018/122691
§ 371 (c)(1),
(2) Date: Jun. 24, 2019

(87) PCT Pub. No.: WO2019/218674
PCT Pub. Date: Nov. 21, 2019

(65) Prior Publication Data
US 2021/0343969 A1    Nov. 4, 2021

(30) Foreign Application Priority Data

May 15, 2018 (CN) .......................... 201810461560.5

(51) Int. Cl.
*H10K 50/80* (2023.01)
*H01L 25/18* (2023.01)
*H10K 102/00* (2023.01)

(52) U.S. Cl.
CPC ............. *H10K 50/80* (2023.02); *H01L 25/18* (2013.01); *H10K 2102/311* (2023.02)

(58) Field of Classification Search
None
See application file for complete search history.

(56) References Cited

U.S. PATENT DOCUMENTS 9,349,969 B2* 5/2016 Kwon ................. H01L 51/0097
2017/0263888 A1* 9/2017 Choi ..................... H01L 51/524
(Continued)

FOREIGN PATENT DOCUMENTS

CN    104347678 A    2/2015
CN    105009188 A    10/2015
(Continued)

OTHER PUBLICATIONS

PCT International Search Report, Application No. PCT/CN2018/122691, dated Mar. 22, 2019, 6 pages: with English translation.
(Continued)

*Primary Examiner* — Hung K Vu
(74) *Attorney, Agent, or Firm* — Armstrong Teasdale, LLP

(57) ABSTRACT

The present disclosure relates to an electronic display device, including a rigid substrate including a first surface, a second surface opposite the first surface, and a side surface coupled between the first surface and the second surface, a flexible OLED layer including a first body segment extending over the first surface of the rigid substrate to form a display front surface of the electronic display device, a second body segment extending over the second surface of the rigid substrate to form a back surface of the electronic display device, and a bent segment coupled between the first body segment and the second body segment, and a functional component coupled to the second body segment of the flexible OLED layer to implement a display function of the electronic display device, the functional component being hidden on the back surface of the electronic display device.

11 Claims, 2 Drawing Sheets

(56) References Cited

U.S. PATENT DOCUMENTS

| | | | |
|---|---|---|---|
| 2017/0278900 A1 | 9/2017 | Yang et al. | |
| 2017/0352834 A1* | 12/2017 | Kim | .................. H01L 51/0097 |
| 2018/0019417 A1 | 1/2018 | Andou | |

FOREIGN PATENT DOCUMENTS

| | | | |
|---|---|---|---|
| CN | 105932036 A | 9/2016 |
| CN | 106782091 A | 5/2017 |
| CN | 107146527 A | 9/2017 |
| CN | 107293215 A | 10/2017 |
| CN | 107564413 A | 1/2018 |
| CN | 107768405 A | 3/2018 |
| CN | 108615748 A | 10/2018 |

OTHER PUBLICATIONS

PCT Written Opinion, Application No. PCT/CN2018/122691, dated Mar. 22, 2019, 5 pages.: with English translation of relevant part.
China Second Office Action, Application No. 201810461560.5, dated Jan. 11, 2021, 15 pps.: with English translation.
China First Office Action, Application No. 201810461560.5, dated Feb. 25, 2020, 13 pps.: with English translation.

\* cited by examiner

ELECTRONIC DISPLAY DEVICE

CROSS REFERENCE TO RELATED APPLICATIONS

This patent application is a National Stage Entry of PCT/CN2018/122691 filed on Dec. 21, 2018, which claims the benefit and priority of Chinese Patent Application No. 201810461560.5 filed on May 15, 2018, the disclosures of which are incorporated by reference herein in their entirety as part of the present application.

BACKGROUND

The present disclosure relates to an electronic device, more particularly, to an electronic display device.

With the development of display technology, OLED (Organic Light Emitting Diode) display has gradually occupied the market. Having excellent visual effects and performance advantages, OLED display has presented clear advantages as the concept of full screen is proposed. OLED display does not need a backlight module, so it can be made very thin. Moreover, OLED features a wide color gamut, extremely high contrast, extremely high reaction speed, flexibility, power saving, etc.

BRIEF DESCRIPTION

The electronic display device according to the present disclosure includes a rigid substrate including a first surface, a second surface opposite the first surface, and a side surface coupled between the first surface and the second surface, a flexible OLED layer including a first body segment extending over the first surface of the rigid substrate to form a display front surface of the electronic display device, a second body segment extending over the second surface of the rigid substrate to form a back surface of the electronic display device, and a bent segment coupled between the first body segment and the second body segment, the bent segment being bent from the first surface to the second surface at an end of the rigid substrate, a functional component coupled to the second body segment of the flexible OLED layer to implement a display function of the electronic display device, the functional component being hidden on the back surface of the electronic display device, wherein the end of the rigid substrate where the bent segment of the flexible OLED layer is located has a rounded shape to reduce stress concentration on the flexible OLED layer.

By forming a rounded shape at the end of the rigid substrate where the bent segment of the flexible OLED layer is located, the portion of the rigid substrate in contact with the flexible OLED layer forms an obtuse angle greater than 90°, so that the stress concentration generated during the contact between the flexible OLED layer and the rigid substrate can be effectively reduced, making the stress distribution uniform. Thereby, the flexible OLED layer will not be worn and break quickly due to sharp angle.

The electronic display device according to the present disclosure may manifest the following advantageous aspects:

The rigid substrate is made of at least one of glass, metal, ceramic, plastic, and resin, and provides rigid support for the entire electronic display device;

The rounded shape is in the form of a convex rounded surface formed by the side surface, thus advantageously reducing the stress concentration on the portion of flexible OLED layer in contact with the rigid substrate;

The convex rounded surface formed by the side surface is arranged symmetrically with respect to an intermediate plane between the first surface and the second surface. The symmetric arrangement enables the stress on the flexible OLED layer to be symmetrically distributed without deflection. The convex rounded surface has a radius of curvature equal to or greater than half of the thickness of the rigid substrate. In one or more embodiments, the convex rounded surface has a radius of curvature equal to half of the thickness of the rigid substrate. The radius of curvature equal to half of the thickness of the rigid substrate can advantageously reduce the stress on the flexible OLED layer to a minimum level, thereby making the flexible OLED layer and a metal film layer contained in the flexible OLED layer hard to break;

The rounded shape is in the form of a rounded corner formed at a transition area between the side surface and the first surface and/or the second surface. The radius of curvature of the rounded corner is less than or equal to half of the thickness of the rigid substrate. In one or more embodiments, the radius of curvature of the rounded corner is equal to half of the thickness of the rigid substrate, which may minimize the stress concentration on the flexible OLED layer; and The functional component includes a driving chip. The driving chip drives the electronic display device to implement various display functions.

The electronic display device according to the present disclosure can produce the following advantageous effect: by forming the rounded shape at positions where the rigid substrate is in contact with the flexible OLED layer, the defect of stress concentration on the flexible OLED layer due to a right-angle transition can be overcome, making the metal film and the metal wire in the flexible OLED layer less likely to break, thus significantly prolonging the service life of the electronic display device.

DETAILED DESCRIPTION

Figure 1:
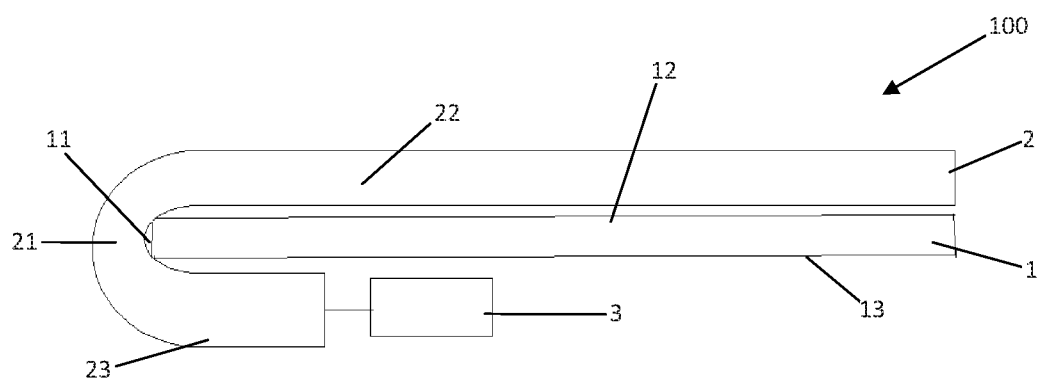
FIG. 1 is a schematic structural of an electronic display device according to the present disclosure.

The embodiments of the present disclosure will be described below in detail with reference to the accompanying drawings. It should be understood that embodiments described herein are only for illustration and explanation of the disclosure, but not for limitation to the scope of the present disclosure.

In the description of the present disclosure, it is to be noted that unless otherwise stated, the orientation or positional relationship indicated by the terms like "upper", "lower", "left", "right", "inner", "outer", "front end", "back end", "head", and "rear" are the orientation or positional relationship shown in the drawings, and are merely for the convenience of describing the present disclosure and simplifying the description, and does not indicate or imply that the device or the components must have a particular orientation, are constructed and operated in a particular orientation, and thus are not to be construed as limiting the disclosure. Furthermore, the terms "first", "second", etc. are used for descriptive purposes only and are not to be construed as indicating or implying relative importance.

In the description of the present disclosure, it should be noted that unless explicitly specified and defined, the terms "installation", "coupled", and "connection" are to be understood broadly. For example, they may be fixed connection, detachable connection, or integral connection, may be mechanical connection or electrical connection, and may be direct connection or indirect connection via an intermediate medium. For persons of ordinary skill in the art, they may understand the meanings of the above terms in the present disclosure according to the situation.

In the OLED display, a full screen is generally formed by bending the PAD. The bending causes stress concentration on the flexible OLED layer near the bend region, making the metal film layer on the flexible OLED layer easy to break.

The electronic display device according to the present disclosure may include the following embodiments.

As shown in FIG. 1, in an electronic display device 100 according to an embodiment of the present disclosure, a rigid substrate 1 provides a rigid support for the entire electronic display device. The rigid substrate 1 including a first surface 12 and a second surface 13 connected by a side surface 11. The flexible OLED layer 2 extends over the first surface 12 of the rigid substrate 1 to form a display front surface of the electronic display device 100 to enable electronic display. The flexible OLED layer 2 includes a bent segment 21 and a first body segment 22 and a second body segment 23 disposed on both ends of the bent segment 21, wherein the first body segment 22 extends over the first surface 12 of the rigid substrate 1 to form the display front surface. The bent segment 21 is connected at one end to the first body segment 22, extends over the side surface 11 of the rigid substrate 1, and is connected to the second body segment 23 extending over the second surface 13 of the rigid substrate 1. The second body segment 23 is disposed on the back of the electronic display device 100. The second body segment 23 is connected to the functional component 3, such that the functional component 3 is hidden behind the electronic display device 100 to acquire a desired full screen design.

In a conventional design, stress concentration is easy to be formed at positions where the rigid substrate 1 is in contact with the flexible OLED layer 2 due to right angles, and the metal film layer in the flexible OLED layer 2 is easy to break due to stress concentration.

Figure 2:
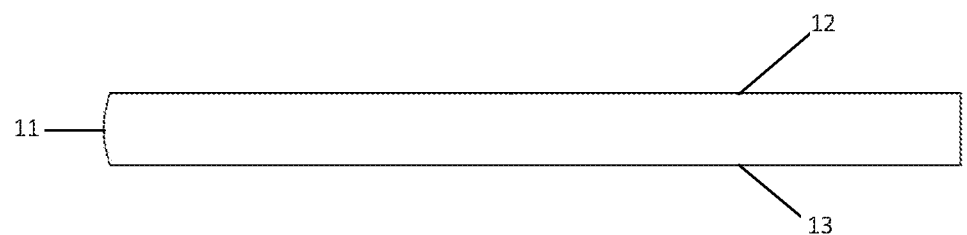
FIG. 2 is a schematic structural of a rigid substrate in an electronic display device according to an embodiment of the present disclosure.

As shown in FIG. 2, in order to solve the problem of stress concentration, the side surface 11 of the rigid substrate 1 is formed as a convex rounded surface. The convex rounded surface can effectively reduce the stress concentration on the bent segment 21 of the flexible OLED layer 2. In one or more embodiments, the convex rounded surface is symmetrically arranged with respect to an intermediate plane between the first surface 12 and the second surface 13 of the rigid substrate 1, the symmetric arrangement making the stress distribution uniform.

When the side surface 11 of the rigid substrate 1 forms a convex rounded surface, it is conceivable that the radius of curvature of the convex rounded surface should be greater than or equal to half of the thickness (i.e., the distance between the first surface 12 and the second surface 13) of the rigid substrate 1.

Figure 4:
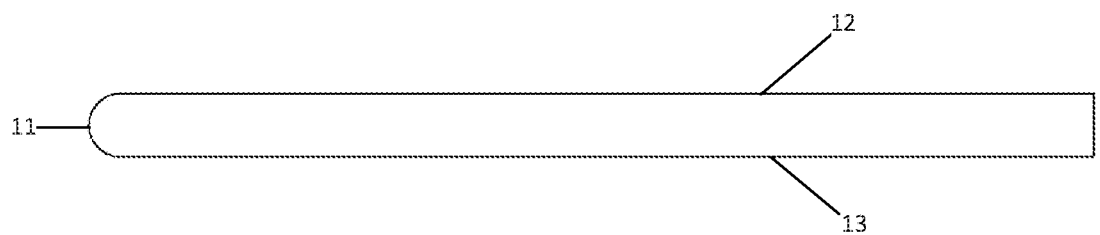
FIG. 4 is a schematic structural of a rigid substrate in an electronic display device according to still another embodiment of the present disclosure.

Simulation software is used to perform a simulated stress analysis on the electronic display device 100 in which the side surface 11 forms a convex rounded surface, wherein the rigid substrate 1 is made of glass and has a thickness of 0.4 mm, and the Young's modulus of the flexible OLED layer 2 is about 100 GPa. It can be obtained that when the radius of curvature of the convex rounded surface is 0.2 mm, the stress in the flexible OLED layer 2 is small, and when the radius of curvature exceeds 0.2 mm, the stress in the flexible OLED layer 2 is gradually increased. It can be seen from the several simulations that regardless of the thickness of the rigid substrate 1, when the radius of the convex rounded surface is equal to half of the thickness of the rigid substrate 1, the stress on the flexible OLED layer 2 can always be minimized. The optimal solution is shown in FIG. 4.

The rigid substrate 1 is made of glass, metal, ceramic, plastic, or resin. That is, the rigid substrate 1 can be made of a conductive material or a non-conductive material.

The functional component 3 includes a driving chip that drives the electronic display device to realize various display functions thereof.

Figure 3:
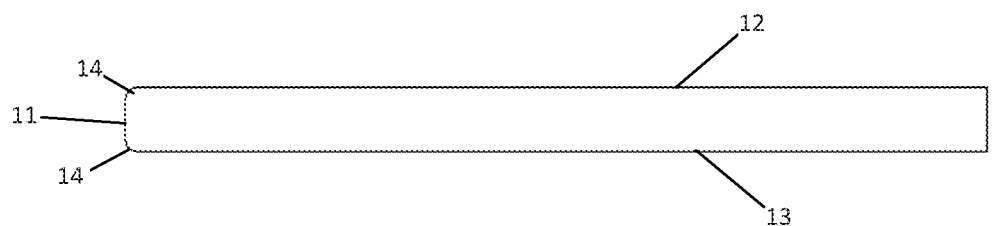
FIG. 3 is a schematic structural of a rigid substrate in an electronic display device according to another embodiment of the present disclosure.

In another embodiment, instead of the convex rounded surface formed by the side surface 11, rounded corners are formed at transition area 14 where the side surface 11 is connected to the first surface 12/second surface 13, as shown in FIGS. 1 and 3. Stress concentration on the contact locations of the flexible OLED layer can also be effectively reduced by forming rounded corners at the transition area 14.

For the solution in which round corners are formed at transition area 14 to reduce stress concentration, it is conceivable that the radius of the rounded corner should be less than or equal to half of the thickness of the rigid substrate 1; otherwise the solution cannot be implemented.

Simulation software is used to perform a simulated stress analysis on the electronic display device 100 in which rounded corners are formed at the transition area 14, wherein the rigid substrate 1 is made of glass and has a thickness of 0.4 mm, and Young's modulus of the flexible OLED layer 2 is about 100 GPa. It can be obtained that as the radius of curvature of the rounded corner increases, the stress on the flexible OLED layer decreases. Therefore, in an optimum solution, the radius of curvature of the rounded corner is equal to half of the thickness of the rigid substrate 1. In this case, the structure of the electronic display device 100 having rounded corners at the transition area 14 is the same as the structure of the electronic display device 100 having a convex rounded surface formed by the side surface 11, i.e., they both form the rigid substrate 1 as shown in FIG. 4. It can be obtained that the optimum structure of the electronic display device 100 having rounded corners at the transition area 14 is the same as the optimum structure of the electronic display device 100 having a convex rounded surface formed by the side surface 11, and in both cases the side surface 11 forms a semicircular surface.

Although the present disclosure has been disclosed above in example embodiments, it is not limited to this. Any variations and modifications made by those skilled in the art without departing from the spirit and scope of the disclosure should be encompassed within the scope of the disclosure, and therefore the protection scope of the disclosure should be defined by the scope defined by the claims.

What is claimed is:

1. An electronic display device comprising:
   a rigid substrate comprising a first surface, a second surface opposite the first surface, and a side surface coupled between the first surface and the second surface;
   a flexible OLED layer comprising a first body segment extending over the first surface of the rigid substrate to form a display front surface of the electronic display device, a second body segment extending over the second surface of the rigid substrate to form a back surface of the electronic display device, and a bent segment coupled between the first body segment and the second body segment, wherein the bent segment is bent from the first surface to the second surface at an end of the rigid substrate; and
   a functional component coupled to the second body segment of the flexible OLED layer to implement a display function of the electronic display device, wherein the functional component is hidden on the back surface of the electronic display device;
   wherein the end of the rigid substrate where the bent segment of the flexible OLED layer is located forms a rounded shape to reduce stress concentration on the flexible OLED layer;
   wherein the rounded shape is in a form of a rounded corner formed at a transition area between the side surface and at least one of the first surface and the second surface; and
   wherein a radius of curvature of the rounded corner is equal to half of a thickness of the rigid substrate.

2. The electronic display device according to claim 1, wherein the rigid substrate is made of at least one of glass, metal, ceramic, plastic, and resin.

3. The electronic display device according to claim 1, wherein the rounded shape is in the form of a convex rounded surface formed by the side surface.

4. The electronic display device according to claim 3, wherein the convex rounded surface formed by the side surface is symmetrically arranged with respect to an intermediate plane between the first surface and the second surface.

5. The electronic display device according to claim 3, wherein the convex rounded surface has a radius of curvature equal to or larger than half of the thickness of the rigid substrate.

6. The electronic display device according to claim 1, wherein the functional component comprises a driving chip.

7. A rigid substrate for an electronic display device, the rigid substrate comprising a first surface, a second surface opposite the first surface, and a side surface coupled between the first surface and the second surface, wherein an end of the rigid substrate forms a rounded shape to reduce stress concentration on a flexible OLED layer of the electronic display device, wherein the rounded shape is in a form of a rounded corner formed at a transition area between the side surface and at least one of the first surface and the second surface, and wherein a radius of curvature of the rounded corner is equal to half of a thickness of the rigid substrate.

8. The rigid substrate according to claim 7, wherein the rigid substrate is made of at least one of glass, metal, ceramic, plastic, and resin.

9. The rigid substrate according to claim 7, wherein the rounded shape is in a form of a convex rounded surface formed by the side surface.

10. The rigid substrate according to claim 9, wherein the convex rounded surface formed by the side surface is symmetrically arranged with respect to an intermediate plane between the first surface and the second surface.

11. The rigid substrate according to claim 9, wherein the convex rounded surface has a radius of curvature equal to or larger than half of a thickness of the rigid substrate.

* * * * *